(12) United States Patent
Pfirsch

(10) Patent No.: US 7,586,161 B2
(45) Date of Patent: Sep. 8, 2009

(54) EDGE STRUCTURE WITH VOLTAGE BREAKDOWN IN THE LINEAR REGION

(75) Inventor: Frank Pfirsch, München (DE)

(73) Assignee: Infineon Technologies AG (DE)

( * ) Notice: Subject to any disclaimer, the term of this patent is extended or adjusted under 35 U.S.C. 154(b) by 447 days.

(21) Appl. No.: 11/439,452

(22) Filed: May 23, 2006

(65) Prior Publication Data

US 2006/0273346 A1 Dec. 7, 2006

(30) Foreign Application Priority Data

May 23, 2005 (DE) .................... 10 2005 023 668

(51) Int. Cl.
*H01L 29/94* (2006.01)
*H01L 21/8249* (2006.01)

(52) U.S. Cl. ..................... 257/378; 438/234

(58) Field of Classification Search ................ 257/378, 257/471, 478, E27.015, E27.017, E27.03–E27.032; 438/202, 234, 570
See application file for complete search history.

(56) References Cited

U.S. PATENT DOCUMENTS

| | | | | |
|---|---|---|---|---|
| 4,573,066 A * | 2/1986 | Whight | ........................ | 257/495 |
| 4,904,609 A * | 2/1990 | Temple | ........................ | 438/140 |
| 5,075,739 A * | 12/1991 | Davies | ........................ | 257/170 |
| 5,113,237 A * | 5/1992 | Stengl | ........................ | 257/489 |
| 5,345,101 A * | 9/1994 | Tu | ........................ | 257/495 |
| 7,187,058 B2 * | 3/2007 | Schmidt | ........................ | 257/626 |
| 7,195,965 B2 * | 3/2007 | Lin et al. | ........................ | 438/202 |
| 2003/0042549 A1 * | 3/2003 | Fujihira et al. | ........................ | 257/378 |
| 2003/0127693 A1 * | 7/2003 | Zeng et al. | ........................ | 257/367 |

FOREIGN PATENT DOCUMENTS

EP 0615291 5/1997

OTHER PUBLICATIONS

Baliga, B.J. et al., "Modern Power Devices," pp. 11. (1987).
Mingues C. et al., "Efficiency of Junction Termination Techniques vs. Oxide Trapped Charges," IEEE, International Symposium on Power Semiconductor Devices and ICs, pp. 137-140 (1997).
Stengl R. et al., "Variation of Lateral Doping-A New Concept to Avoid High Voltage Breakdown of Planar Junction", IEEE International Electron Devices Meeting Digest, 6.4, pp. 154-157 (1985).

* cited by examiner

*Primary Examiner*—Calvin Lee
(74) *Attorney, Agent, or Firm*—Dicke, Billig & Czaja, P.L.L.C.

(57) ABSTRACT

One aspect of the invention relates to an edge structure for a semiconductor component having two electrodes arranged opposite one another on opposite sides of a semiconductor body having a doped zone of the first charge carrier type. The semiconductor body has at least one doped zone of the second charge carrier type extending from a surface into the depth of the semiconductor body and serving for forming a pn junction located in a central region surrounded by an edge region between the two electrodes. The edge region has at least one rectilinear edge section and at least one curved edge section and is formed in such a way that a breakdown voltage in the at least one rectilinear edge section is less than a breakdown voltage in the at least one curved edge section.

18 Claims, 10 Drawing Sheets

US 7,586,161 B2

EDGE STRUCTURE WITH VOLTAGE BREAKDOWN IN THE LINEAR REGION

CROSS-REFERENCE TO RELATED APPLICATIONS

This Utility Patent Application claims priority to German Patent Application No. DE 10 2005 023 668.5, filed on May 23, 2005, which is incorporated herein by reference.

BACKGROUND

One embodiment of the present invention relates to semiconductor components and relates to an edge structure for a semiconductor component having two electrodes arranged opposite one another on opposite sides of a semiconductor body, the semiconductor body having at least one pn junction situated in a central region surrounded by an edge region between the two electrodes.

In a conducting semiconductor component of the type mentioned, a drift zone of the p or n conduction type formed in the semiconductor body carries a charge carrier current between the two electrodes. In a blocking semiconductor component, by contrast, the drift zone takes up a depletion zone of the pn junction, which depletion zone forms on account of the high operating voltages compared with the conducting state. In practical application, semiconductor components having a high blocking capability, such as power diodes, power MOSFETs and IGBTs, and in particular those which are used for switching purposes, are intended to have a highest possible breakdown voltage or dielectric strength. In this case, however, the known problem occurs that at high reverse voltages, relatively high electric fields can arise at the surface of a semiconductor component. On account of the field line curvature, this is a problem primarily in the edge region and in particular in curved edge sections (corners) of the semiconductor component, where particularly large excessive field increases may arise on account of the geometrical form. A voltage breakdown therefore takes place principally in the curved corner regions of a semiconductor component.

In order to avoid this problem, a series of measures have been taken into consideration for constructing an edge termination such that the dielectric strength or breakdown voltage thereof is increased.

Thus, the document "Modern Power Devices" by B. J. Baliga, John Wiley and Sons (USA), 1987, pages 92 et seq. and 99 et seq., proposes the use of one or a plurality of floating field rings for this purpose. In this case, in the semiconductor, annular doping zones separated from one another are arranged around the blocking pn junction, and their potential is not defined, but rather is set to a value between the potentials of the two electrodes at which the reverse voltage is present. Said floating field rings are of the same conduction type (charge type) as the diffused zone of the pn junction and of the opposite conduction type to the drift zone of the semiconductor body. The field rings are doped in such a way that they are not depleted in the off-state case and lead to a lateral expansion of the space charge zone and to a reduction of the electric field strength.

Furthermore, the use of field plates is proposed for this purpose on page 116 et seq. of the document cited. This involves layers having a high conductivity, which include metal or doped polysilicon, for example, which are connected to one of the two electrodes and are situated on an insulating layer above the semiconductor surface in an edge region around the pn junction. The field plates carry the potential of the electrode laterally beyond the pn junction and thereby likewise attain a lateral expansion of the space charge zone.

As a further measure for increasing the breakdown voltage or dielectric strength, the use of a "junction termination extension" (JTE) can be gathered from page 113 et seq. of the document cited. The JTE is a lightly doped, lateral continuation of the highly doped part of the pn junction, which is thus doped oppositely to the drift zone. The JTE is substantially or fully depleted in the off-state case and contains approximately the breakdown charge as doping. In the case of the JTE, the doping may also vary laterally, which is then referred to as a so-called "VLD edge" (VLD=variation of the lateral doping). The variation of the lateral doping is described for example in R. Stengl and U. Gösele, IEEE International Electron Devices Meeting Digest, Abstract 6.4, pages 154-157 (1985).

Furthermore, the use of "semi-insulating layers" is known for this purpose from the document "Modern Power Devices" cited above, on page 126 et seq., and also from the document C. Mingues and G. Chariat, IEEE, International Symposium on Power Semiconductor Devices and ICs, Weimar, pages 137-140 (1997). With semi-insulating layers (e.g. SIPOS=Semiisolating polysilicon), the resistance of which is very much higher than that of, for instance, doped polysilicon but much lower than that of silicon oxide, it is possible to realize resistive field plates. These lie on an insulating layer in the region of the semiconductor edge around the pn junction. They are connected to both electrodes and carry a relatively large leakage current according to the reverse voltage present and their resistance. A potential profile determined by the geometrical form and, if appropriate, by an inhomogeneous distribution of the sheet resistance results within the resistive field plate (see EP 0 615 291 A1, Hitachi, "A high breakdown voltage semiconductor having a semi-insulation layer"), which potential profile in turn controls the lateral extent of the space charge zone.

Edge terminations with other resistance layers, for example, made of high-resistance polysilicon, above the edge region around the pn junction function in a similar manner. These layers may be embodied for example in tracks led spirally multiply around the chip in order to obtain a highest possible resistance and thus a low leakage current.

In addition to the abovementioned precautions for increasing the breakdown voltage or dielectric strength, combinations of the abovementioned precautions are also known, such as, for example floating field rings with field plates, field rings which are put at a defined potential by means of a SIPOS layer (see EP 0 615 291 A1), and also the combination of semi-insulating layers with field plates, floating field rings or a JTE (see EP 0 615 291 A1).

In the abovementioned precautions for increasing the breakdown voltage or dielectric strength of semiconductor components, the following problem occurs:

In industrial mass production it is customary to subject components having a high blocking capability to (if possible) nondestructive materials testing prior to delivery to a customer. In this case, the blocking capability of a semiconductor component is normally tested in such a way that a current having a specific magnitude (for example, 1 mA) is imposed on the switched-off semiconductor component (the semiconductor component is then at avalanche breakdown) and the voltage established across the semiconductor component is measured. It has been shown, however, that the semiconductor components can be destroyed very easily in the case of this test method, possibly even at a value of just a few μA, which may be the case particularly for IGBTs with a field stop zone before the rear-side p-type emitter. The destruction location normally lies in the edge region of the semiconductor component, and in particular in one of the corners thereof ("chip corners"), since, on account of the additional curvature of the pn junction that is present in the chip corners, a higher field strength than at the rectilinear (linear) edge sections arises and, consequently, the avalanche breakdown occurs at a lower voltage in the chip corners than in the rectilinear edge sections. In the case of field stop components, a splitting of the current-carrying region takes place at voltage breakdown, moreover, even at a relatively low current density, and this generally leads to the destruction of the semiconductor component.

In practical applications of semiconductor components, often it is not possible to dependably preclude the occurrence of voltage spikes outside a chip's voltage range specified by the manufacturer for the application, as a result of which the semiconductor component can be destroyed principally in its corner regions.

SUMMARY

In one embodiment of the present invention specifies a semiconductor component which is more robust with respect to the loading mentioned above.

One embodiment of the invention exhibits an edge termination or an edge structure for a semiconductor component which is provided with two electrodes arranged opposite one another on opposite sides of a semiconductor body having a doped zone of the first charge carrier type, the semiconductor body having at least one doped zone of the second charge carrier type extending from one of its surfaces into the depth serving for forming a pn junction located in a central region surrounded by an edge region between the two electrodes. In this case, the edge region is provided with at least one rectilinear edge section and at least one curved edge section and typically has a rectangular or square form in the case of which four rectilinear (linear) edge sections are connected to one another by four curved edge sections (corners).

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
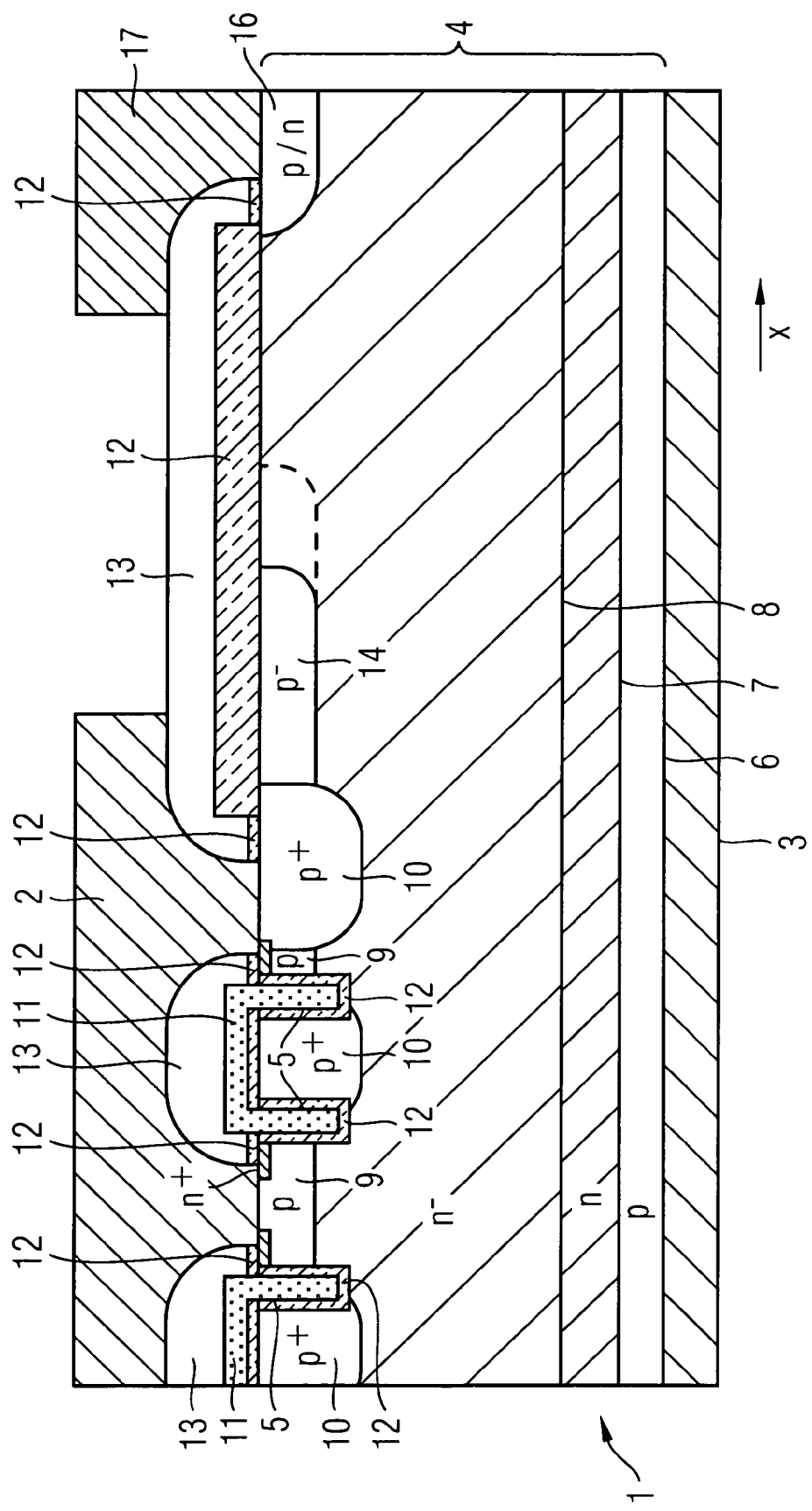
FIG. 1 schematically illustrates a vertical section through a trench IGBT with an edge structure according to one embodiment of the invention with a JTE.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One aspect of the edge structure according to one embodiment of the invention may be seen in the fact that a breakdown voltage in the at least one (or all) rectilinear edge section(s) is less than a breakdown voltage in the at least one (or all) curved edge section(s). What can be achieved by means of this measure is that the structure of the edge termination is designed (in particular optimized) for a high breakdown voltage in the at least one curved edge section (chip corner), while this structure is departed from in the at least one rectilinear edge section, and there as it were a "desired breaking location" is incorporated which is extended over the entire rectilinear edge section.

The expressions "at least one curved edge section" and "at least one rectilinear edge section" as are used here are to be understood analogously always to include a plurality of curved edge sections and rectilinear edge sections, respectively.

In accordance with one embodiment of the invention, the edge structure includes a "junction termination extension" (JTE) known to the person skilled in the art and explained in the introduction. In the case of the JTE, to express it more generally, in the edge region, at least one junction extension zone of the second charge carrier type, said zone being doped more weakly in comparison with the doped zone of the second charge carrier type of the pn junction, is formed in the semiconductor body at the surface thereof, and in a manner extending into the depth thereof, around the at least one pn junction, which junction extension zone adjoins both the doped zone of the second charge carrier type of the pn junction and the doped zone of the first charge carrier type of the semiconductor body. In order, in the case of such a JTE, to obtain a higher breakdown voltage in the at least one curved edge section than in the at least one rectilinear edge section, the JTE is formed according to one embodiment of the invention such that the junction extension zone has a larger lateral dimensioning in the at least one curved edge section than in the at least one rectilinear edge section.

Here and hereinafter the expression "lateral dimensioning" is to be understood as a shortest dimensioning in a lateral direction, a lateral direction being parallel to the surface of the semiconductor body (that is to say the surface of the semiconductor body at which a doped zone of the second charge carrier type extending into the depth is formed for the purpose of forming a pn junction), and pointing from its central region toward its edge region (to put it another way: from the inner portion outward).

In this case, in one embodiment the lateral dimensioning of the junction extension zone in the at least one curved edge section is at least 10% and at most 30% greater than the lateral dimensioning in the at least one rectilinear edge section.

In accordance with one embodiment, the edge structure includes, around the at least one pn junction, a junction extension zone of the second charge carrier type, said zone being doped more weakly in comparison with the doped zone of the second charge carrier type of the pn junction and is formed in the semiconductor body at the surface thereof and in a manner extending into the depth thereof and adjoins both the doped zone of the second charge carrier type of the pn junction and the doped zone of the first charge carrier type of the semiconductor body (JTE). In one case, the junction extension zone has a laterally varying dopant concentration, such that a dopant concentration adjoining the doped zone of the second charge carrier type of the pn junction is lower in the at least one rectilinear edge section than in the at least one curved edge section. This refinement of the invention may be combined with the previous refinement of the invention, in which the JTE is formed according to one embodiment of the invention such that the junction extension zone has a larger lateral dimensioning in the at least one curved edge section than in the at least one rectilinear edge section, in order in this way to obtain a combined effect on the reduction of the breakdown voltage in the at least one curved edge section.

In accordance with one embodiment of the invention, the edge structure includes, in the edge region, at least one doped floating zone of the second charge carrier type, which zone surrounds the at least one pn junction and is formed in the semiconductor body at the surface thereof and in a manner extending toward the depth. The electrically non-connected (that is to say floating) floating zone is separated from the doped zone of the second charge carrier type of the pn junction by the doped zone of the first charge carrier type of the semiconductor body. Here and hereinafter the floating zone is designated by "field ring" without restriction to an annular shape. In the case of a plurality of field rings, the latter are separated from one another by the doped zone of the first charge carrier type of the semiconductor body. The field rings are not depleted in the off-state case and lead to a lateral expansion of the space charge zone.

In order to obtain the desired property that the breakdown voltage is lower in the at least one rectilinear edge section than in the at least one curved edge section, the field rings are at a greater spatial distance from the doped zone of the second charge carrier type of the pn junction in the at least one rectilinear edge section than in the at least one curved edge section. In the case of a plurality of field rings, the distance between at least one field ring and a field ring situated further innerly is enlarged in the at least one rectilinear edge section in comparison with the at least one curved edge section. This also includes the fact that the at least one field ring whose distance from a field ring situated further innerly is enlarged in the at least one rectilinear edge section in comparison with the at least one curved edge section is at a greater spatial distance from the doped zone of the second charge carrier type of the pn junction in the at least one rectilinear edge section in comparison with the at least one curved edge section.

In one embodiment of the invention, the edge structure includes, in the edge region, on the semiconductor body and isolated from the latter by an insulating material, at least one layer (designated here and hereinafter as "field plate") surrounding the at least one pn junction and including at least one (highly) conductive material, such as metal or doped polysilicon, for example, by means of which the potential of the electrode is passed laterally beyond the pn junction and a lateral expansion of the space charge zone is thus achieved. In one embodiment, at least one of the field plates has a larger lateral dimensioning in the at least one curved edge section than in the at least one rectilinear edge section. Such field plates made of at least one highly conductive material may be formed in single-stage or multistage fashion. Multistage field plates, may in this case also be composed of sections made of different materials. The field plates are in one case connected to one of the two electrodes. Furthermore, the field plates may be combined in particular with the field rings explained further above, in order in this way to obtain a combined effect when reducing the breakdown voltage in the at least one rectilinear edge section in comparison with the at least one curved edge section.

In accordance with one embodiment of the invention, at least one field plate is arranged in the edge region on the semiconductor body and isolated from the latter by an insulating material, and a channel stopper structure surrounding the field plate is furthermore provided in the edge region, which structure is arranged at the furthest outer point as viewed in the lateral direction. The channel stopper structure in this case serves for laterally delimiting the space charge zone and may be formed as a doping zone or as a channel stopper field plate. What is essential in this case is that a spatial distance between the outermost field plate and the channel stopper structure lying at an even further outer point is reduced in the at least one rectilinear edge section in comparison with the at least one curved edge section.

In accordance with one embodiment of the invention, at least one semi-insulating layer and/or resistance layer, for example, made of high-resistance polysilicon, which surrounds the at least one pn junction and is connected to the two electrodes is arranged in the edge region on the semiconductor body and isolated from the latter by an insulating material. In this case, the semi-insulating layer or resistance layer is designed such that at a specific reverse voltage, an impressed lateral field strength component has a higher magnitude in the rectilinear edge section than in the curved edge section. This may be achieved for example by the lateral extent of the semi-insulating layer or resistance layer being smaller in the rectilinear edge section than in the curved edge section. A further possibility consists in the distribution of the conductivity of the semi-insulating layer or resistance layer being provided non-uniformly in a targeted manner in the rectilinear edge section.

According to embodiments of the invention, any desired combination of the refinements of the invention explained above is possible. Likewise, any desired combination of the refinements of the invention explained above with other measures—known to the person skilled in the art and not presented here—for increasing the breakdown voltage in the edge region of a semiconductor component is possible.

Embodiments of the invention furthermore extend to a semiconductor component, in particular a power semiconductor component, such as an IGBT (insulated gate bipolar transistor) and MOSFET (metal oxide field effect transistor), with an edge structure as explained above.

Reference is firstly made to FIG. 1, which schematically illustrates a vertical section through a trench IGBT with an embodiment of an edge structure according to one embodiment of the invention with a JTE.

A trench IGBT designated in its entirety by the reference numeral 1 includes in a conventional manner a front side electrode 2, a rear side electrode 3 and a semiconductor body 4 arranged between the front and rear side electrodes and having a front surface and a rear surface. Hereinafter, "surface" means the front-side surface of the semiconductor body 4. A trench structure having trenches 5 that are parallel to one another is formed in the semiconductor body 1 on the front side. In plan view this corresponds to a strip-type pattern of the trenches. As an alternative, the trenches could run around respective individual cells for example in square or hexagonal form. The semiconductor 4 includes, in the direction from the rear side electrode 3 to the front side electrode 2, a p-doped anode zone 6 as emitter for minority charge carriers, an n-doped field stop zone 7, a weakly n-doped drift zone 8 and p-doped zones 9, 10, namely base zones 9 and p$^+$-doped zones 10. The trenches 5 accommodate control electrodes 11, which are insulated from their surroundings from the base zones 9 by means of the insulating layer 12. The front side electrode 2 is in a direct electrical contact with the n$^+$-doped emitter zones 12 and the p-doped base zones 9. The rear side electrode 3 is in direct contact with the p-doped anode zone 6. A layer 13 made of BPSG (boron phosphorus doped silica glass) is situated between the front side electrode 2 and a part of the control electrodes 11 and also a part of the oxide layer 12.

An edge structure is formed in the edge region of the IGBT 1, said edge structure including a junction extension zone 14 that is p$^-$-doped more weakly in comparison with the p$^+$-doped zones 10 of the pn junctions in the semiconductor body 4 at the surface thereof and extending into the depth thereof, around the at least one pn junction (JTE). In this case, this JTE adjoins both the p$^+$-doped zone 10 of the pn junction and the weakly n$^-$-doped drift zone 8 of the semiconductor body 4. In order, in the case of such a JTE, to obtain a higher breakdown voltage in curved edge sections than in rectilinear edge sections, the JTE is formed according to one embodiment of the invention such that the junction extension zone has a larger lateral dimensioning in the curved edge sections (corner regions) than in the rectilinear edge sections.

Both cases are illustrated in FIG. 1. The larger lateral dimensioning in the curved edge sections being identified by the JTE illustrated using dashed lines, while the shorter lateral dimensioning in the rectilinear edge sections is identified by the JTE illustrated using solid lines. Lateral dimensioning is to be understood in FIG. 1 as a shortest dimensioning in a lateral direction which lies parallel to the surface of the semiconductor body 4 and points from the central region thereof toward the edge region thereof, as is indicated by the arrow direction x. In this case, the lateral dimensioning of the JTE 14 in the curved edge sections is at least 10% and at the most 30% greater than the lateral dimensioning of the JTE 14 in the rectilinear edge sections.

In the edge region, there is deposited on the semiconductor body 4 an oxide layer 12 and also a BPSG layer 13. A p- or n-doped zone 16 having the function as a channel stopper is furthermore formed in the semiconductor body 4, at a furthest outer point in a lateral direction, in the surface thereof and extending toward the depth. A channel stopper electrode 17 is arranged above said zone in direct electrical contact with the doped zone 16.

Figure 2:
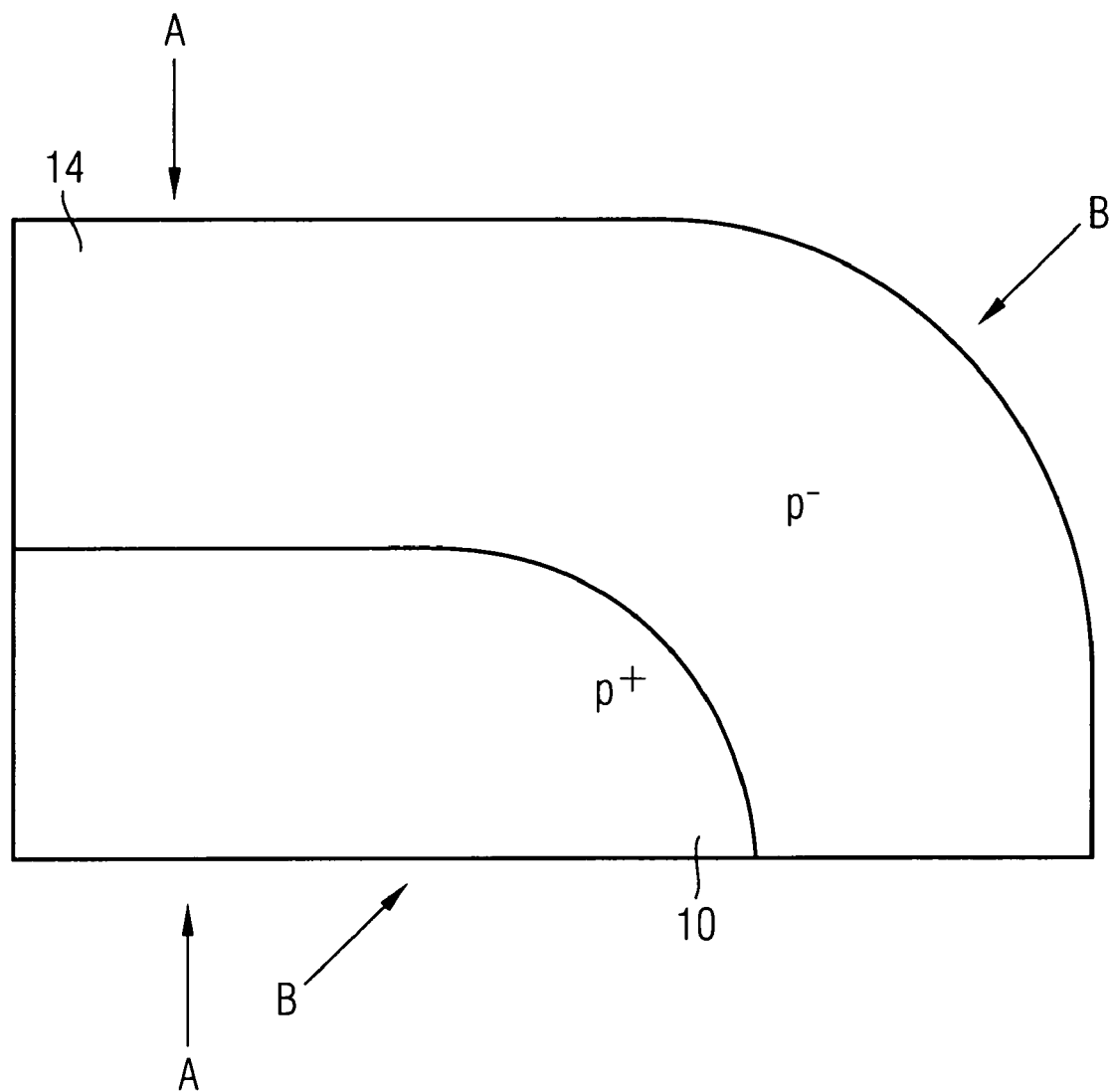
FIG. 2 schematically illustrates, in a layout plan view, a configuration of a corner region of the trench IGBT from FIG. 1.
Figure 3:
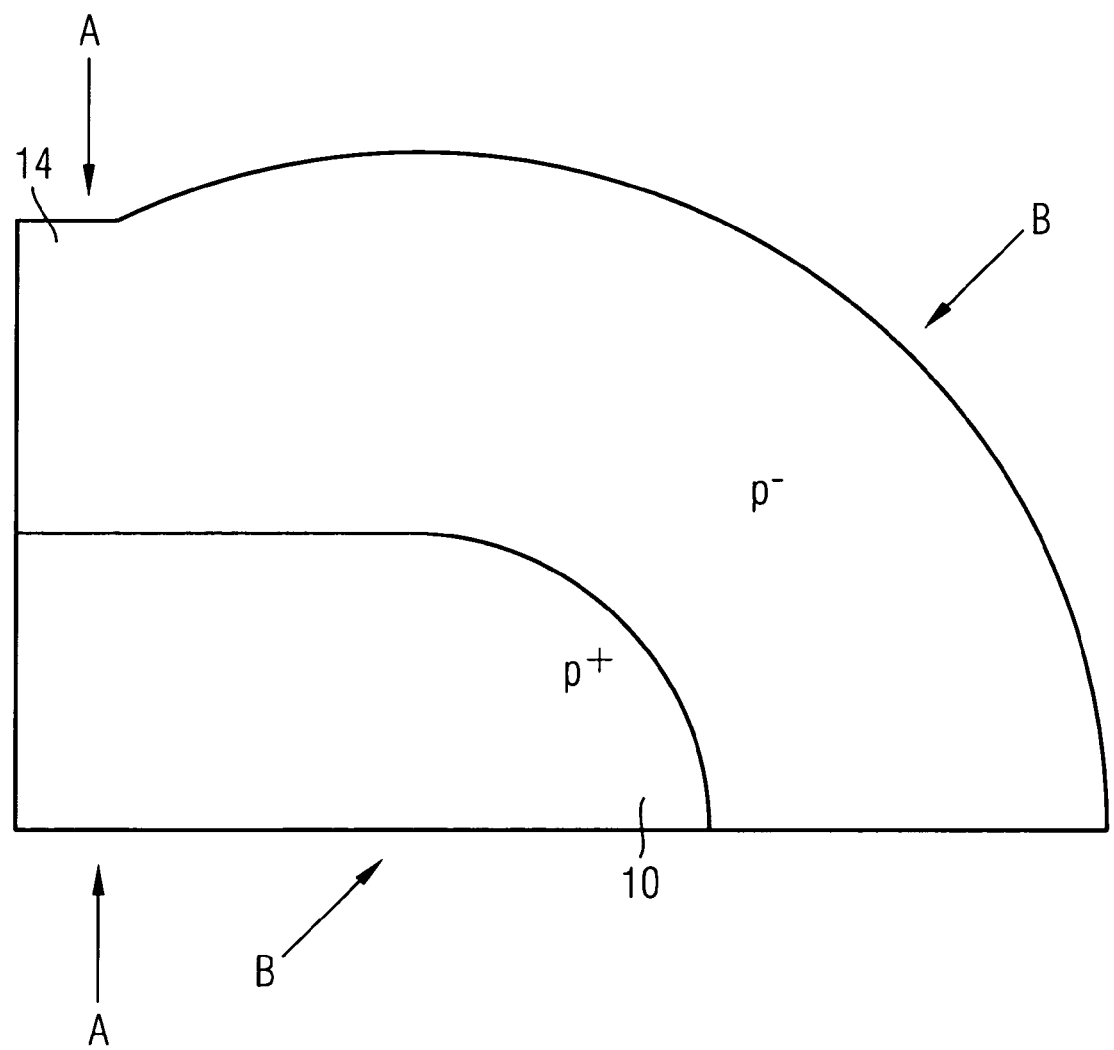
FIG. 3 schematically illustrates, in a layout plan view, a further configuration of a corner region of the trench IGBT from FIG. 1.

FIGS. 2 and 3 schematically illustrate in each case a layout plan view in a corner region of the trench IGBT from FIG. 1. In this case, FIG. 2 illustrates a configuration of the JTE 14 in which an increase in the lateral dimensioning of the JTE 14 commences in the rectilinear edge section essentially only with the incipient curvature of the corner region, in order finally to attain the lateral dimensioning of the JTE 14 in the curved edge section. The lateral dimensioning of the JTE 14 along B-B (curved edge section) is greater than the lateral dimensioning of the JTE 14 along section A-A (rectilinear edge section).

In the configuration illustrated in FIG. 3, in contrast to the configuration illustrated in FIG. 2, an increase in the lateral dimensioning of the JTE 14 commences in the rectilinear edge section essentially already in the rectilinear corner region in order finally to attain the lateral dimensioning of the JTE 14 in the curved edge section. In this case, in horizontal section, the differently doped zones in the curved edge section are essentially like concentric ring sections.

The subsequent figures schematically illustrate vertical sections through an edge region of an (otherwise identical) trench IGBT with different embodiments of the edge structure according to embodiments of the invention. In order to avoid unnecessary repetition, only the differences in the edge structures are explained and reference is otherwise made to the explanations made in FIGS. 1 to 3.

Figure 4:
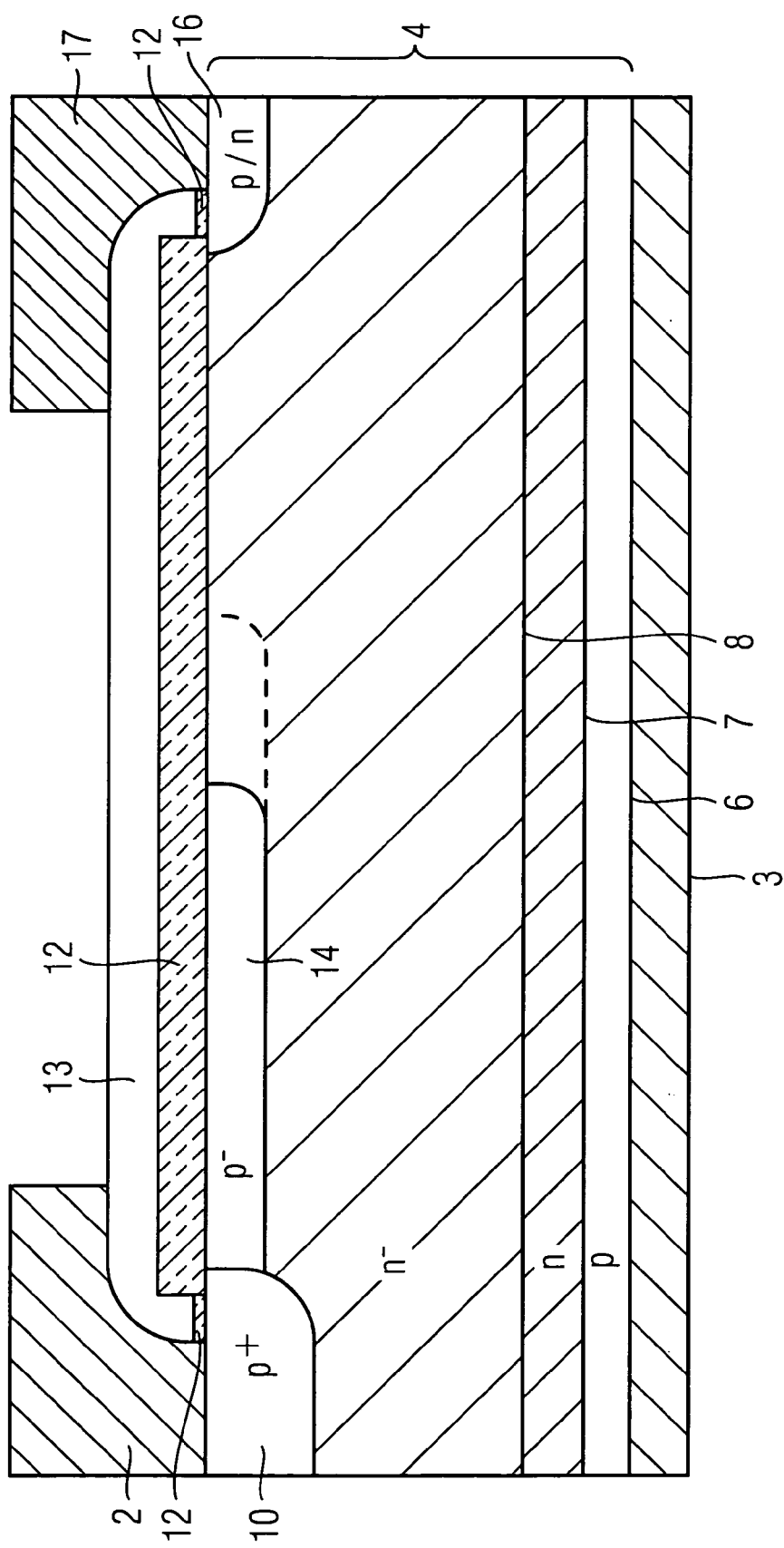
FIG. 4 schematically illustrates a vertical section through an edge region of a trench IGBT with an edge structure according to one embodiment of the invention with a JTE.
Figure 5:
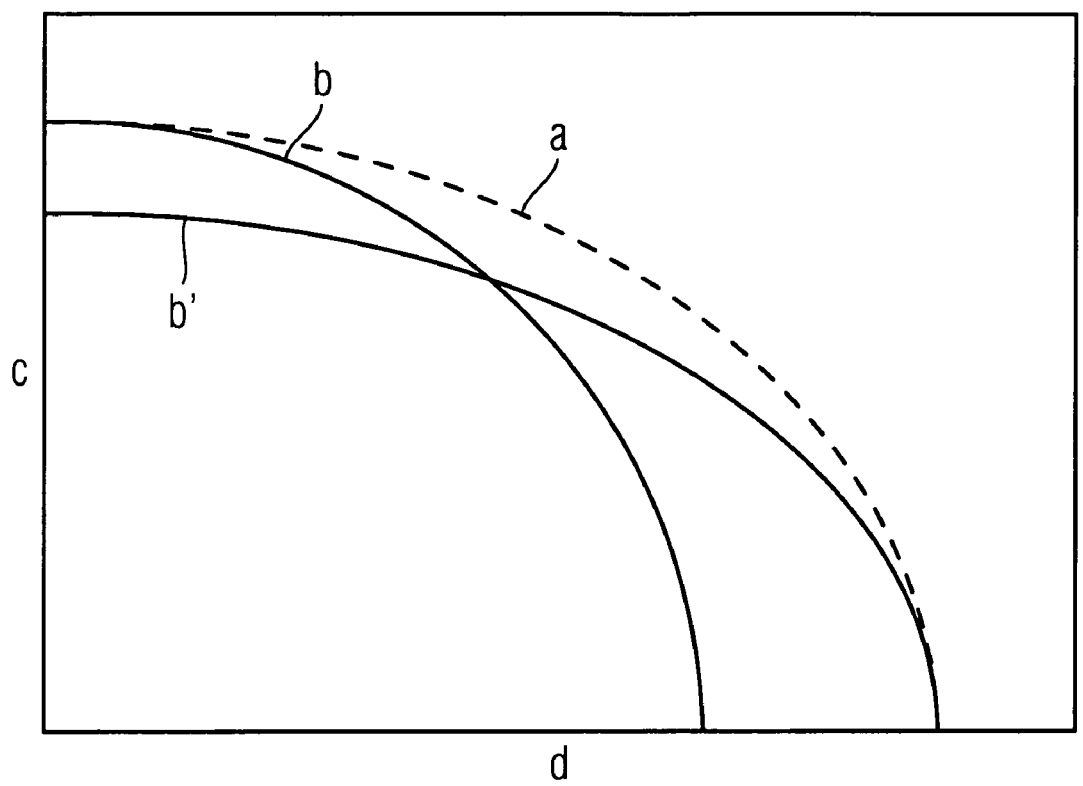
FIG. 5 schematically illustrates a variation of the dopant concentration in the JTE from FIG. 4.

Reference is now made to FIGS. 4 and 5, which schematically illustrate in each case a vertical section through an edge region of a trench IGBT, as illustrated in FIG. 1, with an edge structure according to a further embodiment of the invention with a JTE. In FIG. 4, the different lateral dimensions of the JTE 14 in rectilinear edge sections and in curved edge sections correspond to those as have been explained in connection with FIGS. 1 to 3. In addition, the JTE 14 in this case has a dopant concentration that varies in a lateral direction, and in one case such that a dopant concentration of the JTE 14 that adjoins the p$^+$-doped zone 10 of the pn junction in the rectilinear edge section is lower than a dopant concentration of the JTE 14 in the curved edge section.

FIG. 5, which diagrammatically illustrates the profile of a dopant concentration as a function of a distance d from the p$^+$-doped zone 10 of the pn junction, illustrates a possible profile of the dopant concentrations of the JTE 14. In this case, curve a corresponds to a dopant concentration of the JTE in a curved edge section, while curve b' corresponds to a dopant concentration according to the invention of the reduction of the breakdown voltage in the rectilinear edge sections. The dopant concentration of the rectilinear edge section that adjoins the p$^+$-doped zone 10 of the pn junction is clearly lower than the same dopant concentration of the curved edge section. For comparison thereof, curve b illustrates a further profile according to one embodiment of the invention of a varying dopant concentration in a rectiliear edge section. This profile according to one embodiment of the invention of a varying dopant concentration in a rectilinear edge section clearly differs from the profile in the curved edge section to the effect that it has a smaller width than the dopant concentration profile in the curved edge section.

By combining a variation of the lateral dimensioning and a variation of the dopant concentration of the JTE with regard to curved and rectilinear edge sections, it is thus possible to obtain a combined effect on the reduction of the breakdown voltage in the rectilinear edge sections.

Figure 6:
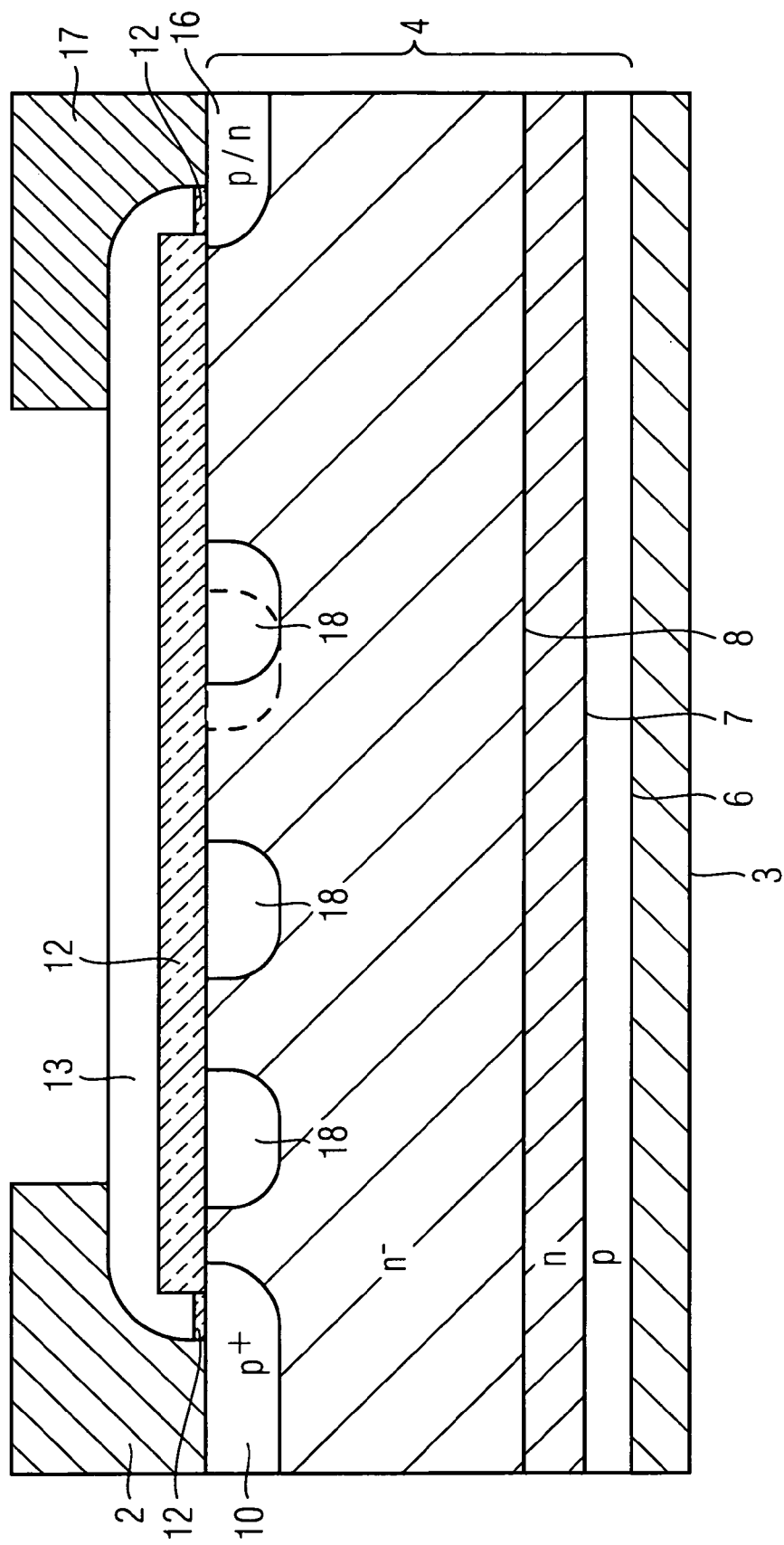
FIG. 6 schematically illustrates a vertical section through an edge region of a trench IGBT with an edge structure according to one embodiment of the invention.

Reference is now made to FIG. 6, which schematically illustrates a vertical section through an edge region of a trench IGBT with an edge structure according to a further embodiment of the invention with field rings at a varying distance from the pn junction in the edge region. Accordingly, floating field rings 18 are formed in the semiconductor body 4 at the surface thereof, and extending toward the depth. The field rings are not connected electrically and are separated from the p$^+$-doped zone 10 of the pn junction and from one another by the n$^-$-doped drift zone 8 of the semiconductor body 4. The field rings 18 are not depleted in the off-state case and lead to a lateral expansion of the space charge zone. In order to obtain the desired property that the breakdown voltage is lower in the at least one rectilinear edge section than in the at least one curved edge section, a field ring 18 in the at least one rectilinear edge section is at a greater spatial distance from the p$^+$-doped zone 10 of the pn junction or from the field ring situated further innerly (solid line) than the field ring 18 in the at least one curved edge section (dashed line). The two cases are illustrated in FIG. 6. The other field rings are each at an identical distance from one another.

Figure 7:
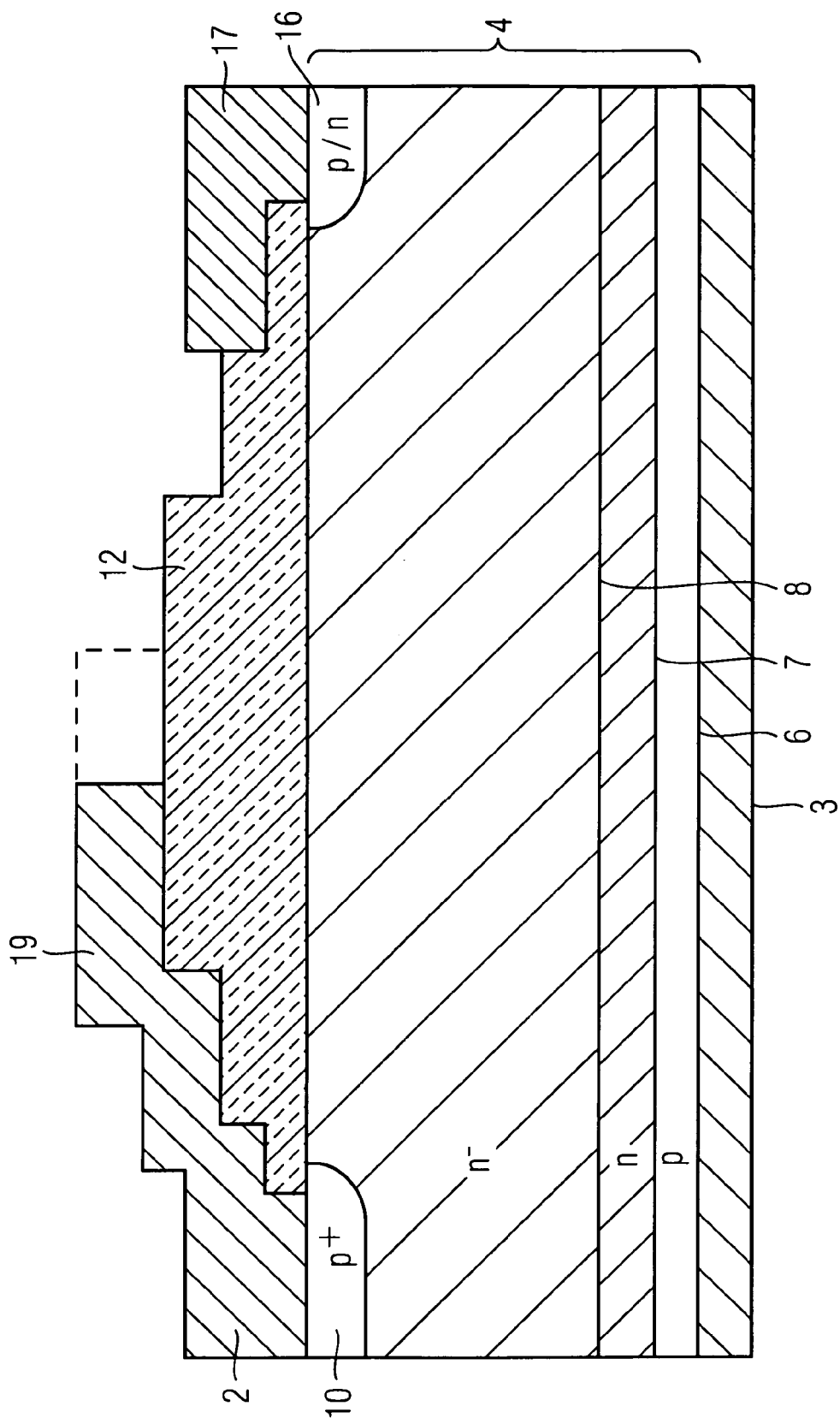
FIG. 7 schematically illustrates a vertical section through an edge region of a trench IGBT with an edge structure according to one embodiment of the invention.

FIG. 7 schematically illustrates a vertical section through an edge structure according to a further embodiment of the invention in a trench IGBT, in which said edge structure is provided with a multistage field plate having a varying distance from the pn junction in the edge region. Accordingly, a multistage field plate 19 made of a highly conductive material, such as metal or doped polysilicon, for example, is provided above the semiconductor body 4, isolated from the latter by the oxide layer 12, in the form of an extension of the top contact electrode 2, or in electrical contact therewith. In this case, the multistage field plate 19 is formed in such a way that it has a larger lateral dimensioning in the at least one curved edge section (dashed line) than in the at least one rectilinear edge section (solid line). The multistage field plate 19 may be composed of a plurality of sections made of different materials.

Figure 8:
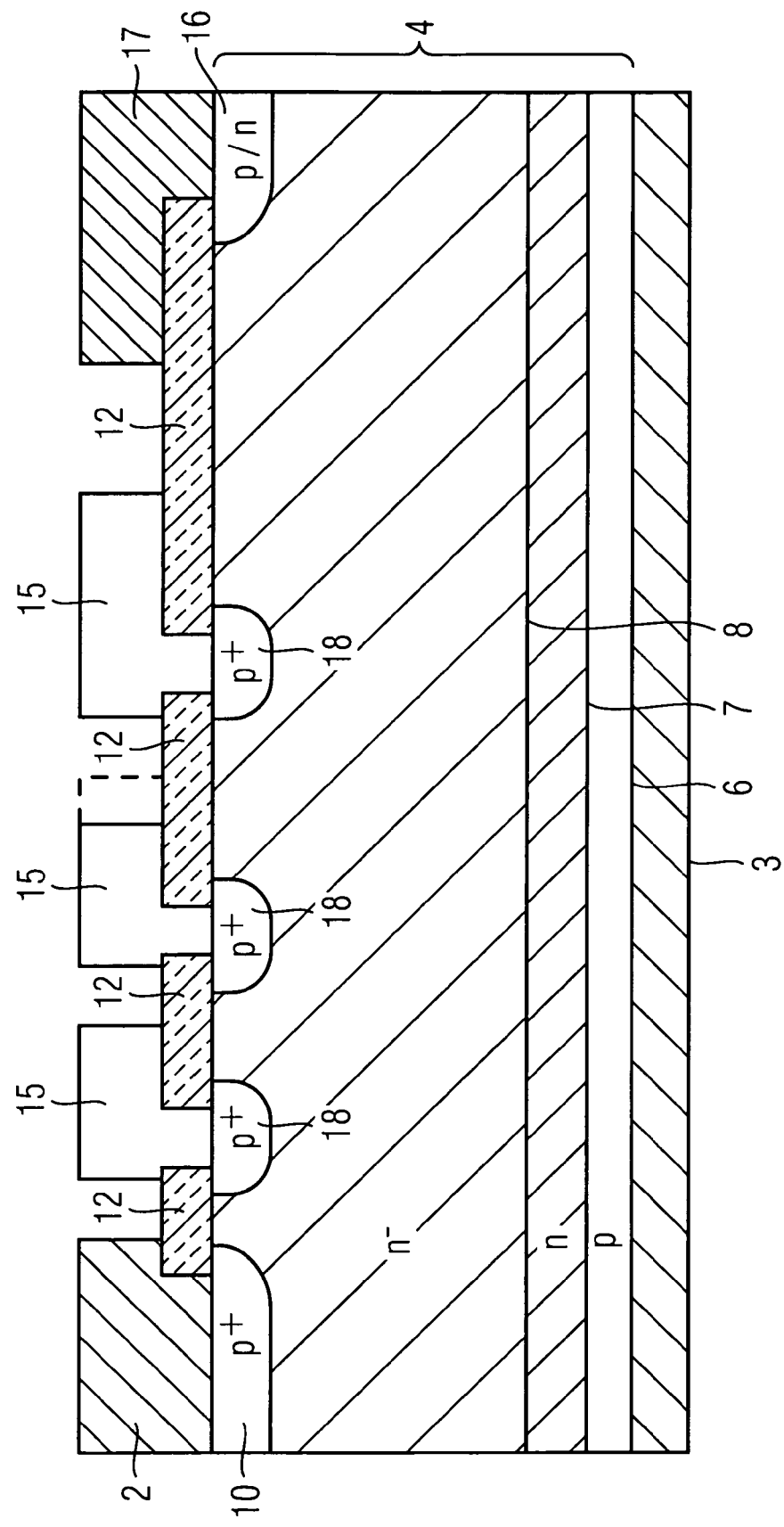
FIG. 8 schematically illustrates a vertical section through an edge region of a trench IGBT with an edge structure according to one embodiment of the invention.

FIG. 8 schematically illustrates a vertical section through an edge structure according to a further embodiment of the invention in a trench IGBT. In the embodiment of FIG. 8, floating field rings 18, such as have already been described in FIG. 6, in which the spatial distance with respect to the p$^+$-doped zone 10 of the pn junction with respect to the field ring situated further innerly may vary, are combined with single- or multistage field plates 15. The field plates 15 are here in each case in electrical contact with an underlying floating field ring 18. The various field plates are isolated from the top contact electrode 2 and from one another by an oxide layer 12. In order to obtain the desired effect, at least one of the field plates 15 is formed in such a way that it has a larger lateral dimensioning in the at least one curved edge section (dashed line) than in the at least one rectilinear edge section (solid line). FIG. 8 illustrates these two cases by way of example in one drawing. Through the combination of field plates and field rings it is possible to obtain a combined effect on the dielectric strength of the rectilinear and curved edge sections.

Figure 9:
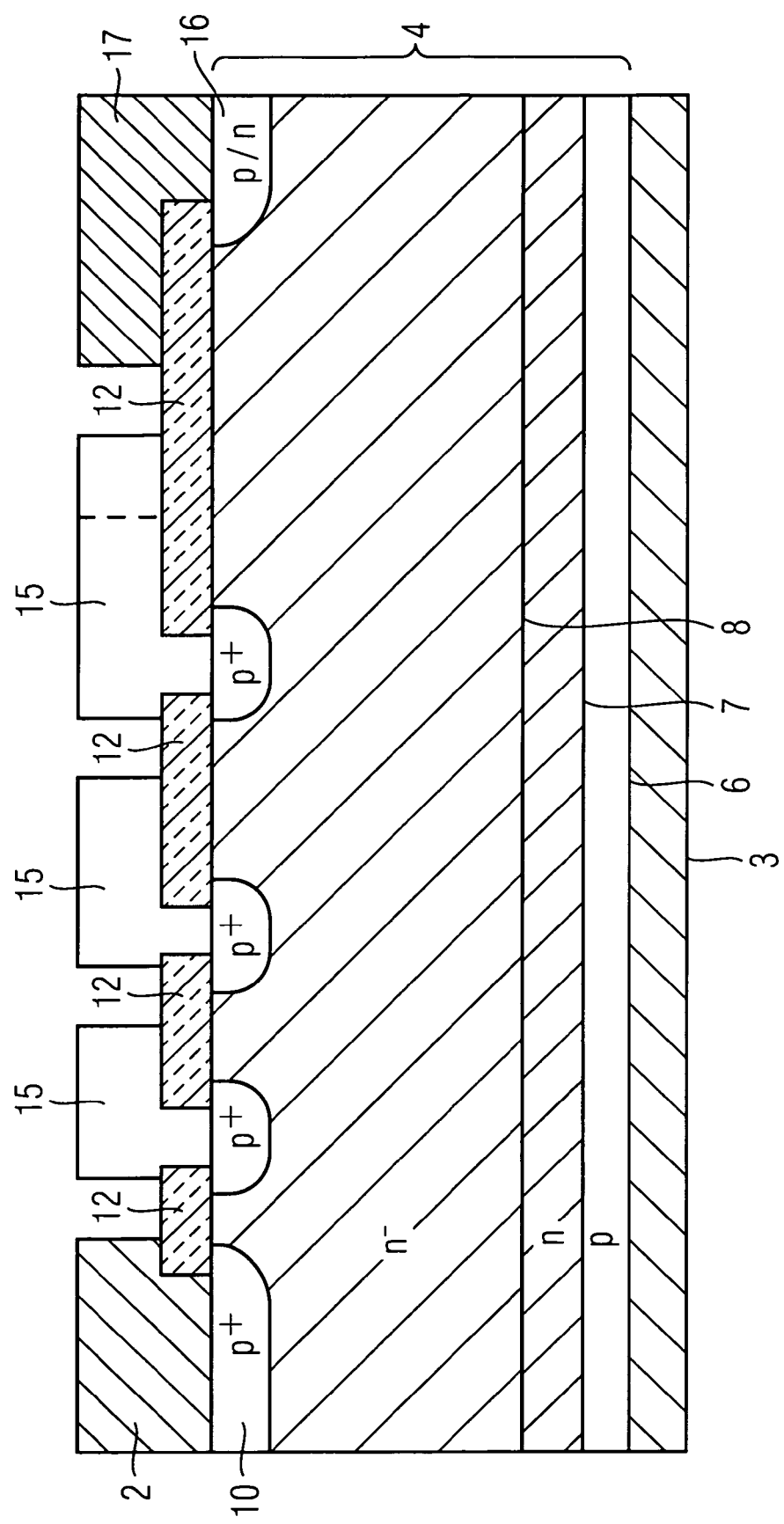
FIG. 9 schematically illustrates a vertical section through an edge region of a trench IGBT with an edge structure according to one embodiment of the invention.
Figure 10:
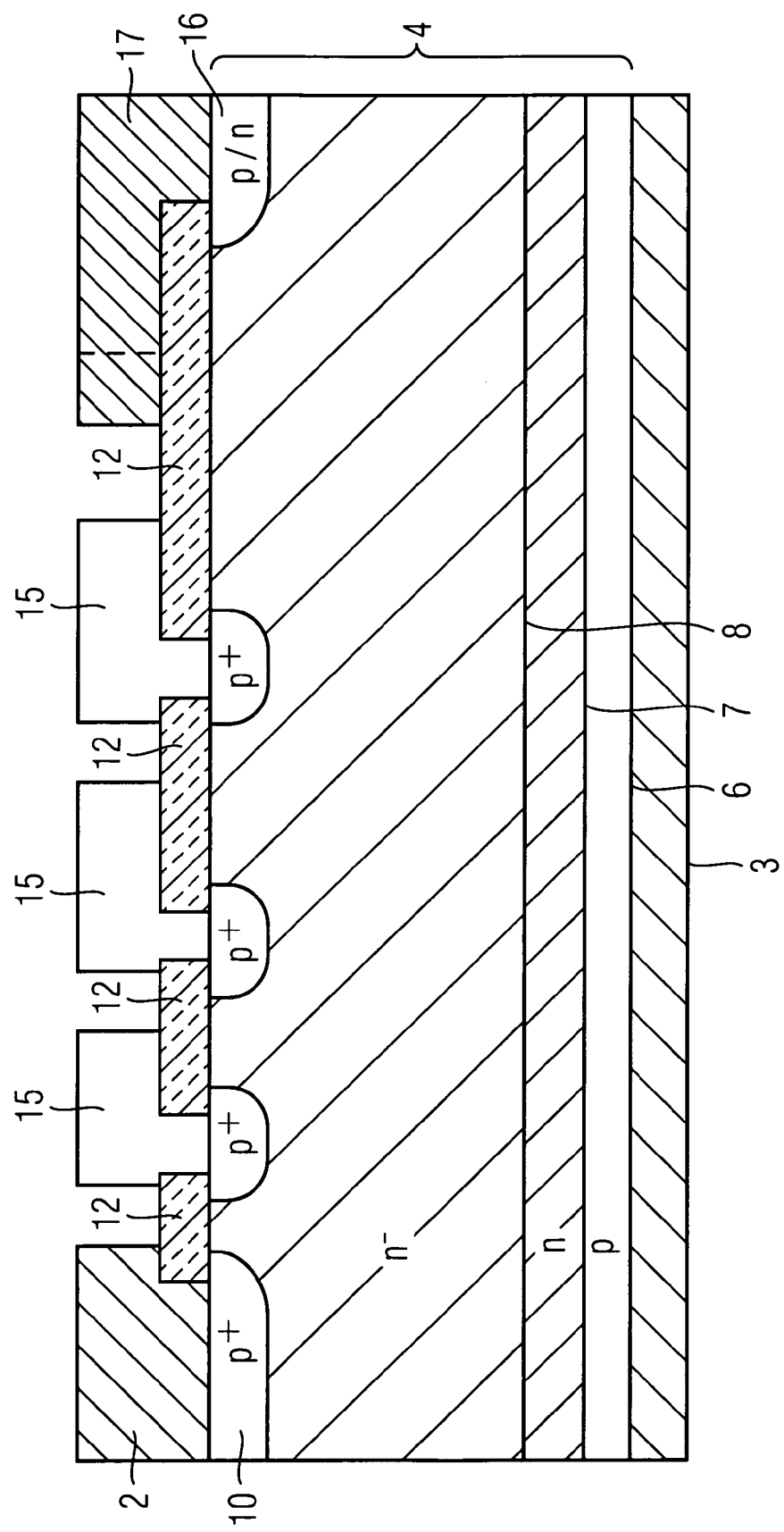
FIG. 10 schematically illustrates a vertical section through an edge region of a trench IGBT with a further embodiment of an edge structure according to the invention.

Finally, FIGS. 9 and 10 schematically illustrate in each case a vertical section through the edge structure according to an embodiment of the invention of a trench IGBT, in which field rings such as have already been described in FIG. 6 and field plates such as have already been described in FIG. 8 are provided. Accordingly, in order to obtain the desired effect, a field plate 15 situated at the furthest outer point in a lateral direction is formed in such a way that it is at a greater distance from the channel stopper 17 in the at least one curved edge section (dashed line) than in the at least one rectilinear edge section (solid line).

In this case, FIG. 9 illustrates a variant in which a lateral dimensioning of the field plate 15 is enlarged in the rectilinear edge section, while FIG. 10 illustrates a variant in which a lateral dimensioning of the channel stopper 17 is enlarged. Both variants attain the same result of a reduced distance between the outermost field plate 15 and the channel stopper 17. Through the combination of field plates and field rings it is possible to obtain a combined effect on the dielectric strength of the rectilinear and curved edge sections.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An edge structure for a semiconductor component having two electrodes arranged opposite one another on opposite sides of a semiconductor body having a doped zone of the first charge carrier type, the semiconductor body having at least one doped zone of the second charge carrier type extending from a surface into the depth of the semiconductor body and serving for forming a pn junction located in a central region, the edge structure comprising:
    an edge region surrounding the central region between the two electrodes;
    wherein the edge region has at least one rectilinear edge section being rectilinear in a plane parallel to the surface of the semiconductor body and at least one curved edge section being curved in the plane parallel to the surface of the semiconductor body and is formed in such a way that a breakdown voltage in the at least one rectilinear edge section is less than a breakdown voltage in the at least one curved edge section.

2. The edge structure of claim 1:
    wherein at least one junction extension zone of the second charge carrier type is formed in the semiconductor body at the surface thereof in the edge region, and is formed in a manner extending into the depth thereof, around the at least one pn junction;
    wherein the junction extension zone doped more weakly in comparison with the doped zone of the second charge carrier type of the pn junction;
    wherein the junction extension zone adjoins both the doped zone of the second charge carrier type of the pn junction and the doped zone of the first charge carrier type of the semiconductor body (JTE=Junction Termination Extension); and
    wherein the JTE has a larger lateral dimensioning in the at least one curved edge section than in the at least one rectilinear edge section.

3. The edge structure of claim 2, wherein the lateral dimensioning of the JTE in the at least one curved edge section is at least 10% and at most 30% greater than the lateral dimensioning of the JTE in the at least one rectilinear edge section.

4. The edge structure of claim 2, wherein the JTE has a laterally varying dopant concentration, the dopant concentration in the vicinity of the doped zone of the second charge carrier type of the pn junction being lower in the at least one rectilinear edge section than in the at least one curved edge section.

5. The edge structure of claim 1:
wherein at least one junction extension zone of the second charge carrier type is formed in the semiconductor body at the surface thereof, in the edge region around the at least one pn junction;
wherein the junction extension zone is doped more weakly in comparison with the doped zone of the second charge carrier type of the pn junction;
wherein the junction extension zone adjoins both the doped zone of the second charge carrier type of the pn junction and the doped zone of the first charge carrier type of the semiconductor body (JTE); and
wherein the JTE has a laterally varying dopant concentration, the dopant concentration in the vicinity of the doped zone of the second charger carrier type of the pn junction being lower in the at least one rectilinear edge section than in the at least one curved edge section.

6. The edge structure of claim 1:
wherein at least one junction extension zone of the second charge carrier type is formed in the semiconductor body at the surface thereof in the edge region, around the at least one pn junction;
wherein the junction extension zone is doped more weakly in comparison with the doped zone of the second charge carrier type of the pn junction;
wherein the junction extension zone adjoins both the doped zone of the second charge carrier type of the pn junction and the doped zone of the first charge carrier type of the semiconductor body (JTE); and
wherein the JTE has a laterally varying dopant concentration, the lateral width of the laterally varying dopant concentration being smaller in the at least one rectilinear edge section than in the at least one curved edge section.

7. The edge structure of claim 1:
wherein at least one additional doped zone of the second charge carrier type is formed in the semiconductor body at the surface thereof surrounding the pn junction, and is formed in a manner extending toward the depth;
wherein the at least one additional doped zone is separated from the doped zone of the second charge carrier type of the pn junction by the doped zone of the first charge carrier type of the semiconductor body ("field ring");
wherein the field ring is at a greater spatial distance from the doped zone of the second charge carrier type of the pn junction in the at least one rectilinear edge section than in the at least one curved edge section.

8. The edge structure of claim 7, wherein a plurality of field rings are provided, the distance between at least one field ring and a field ring situated further innerly is enlarged in the at least one rectilinear edge section in comparison with the at least one curved edge section.

9. The edge structure as of claim 1, wherein a highly conductive material surrounding the at least one pn junction is arranged in the edge region on the semiconductor body and in a manner isolated from the latter by an insulating material, and wherein the highly conductive material has a larger lateral dimensioning in the at least one curved edge section than in the at least one rectilinear edge section.

10. The edge structure of claim 9, wherein the highly conductive material forms a field plate which is electrically connected to the doped zone of the second charge carrier type of the pn junction.

11. The edge structure of claim 9, further comprising at least one field ring, wherein the highly conductive material forms a field plate which is electrically connected to the at least one field ring.

12. The edge structure of claim 1, wherein a highly conductive material surrounding the at least one pn junction is arranged in the edge region on the semiconductor body and in a manner isolated from the latter by an insulating material, and which furthermore has a channel stopper structure surrounding the highly conductive material in the edge region, and wherein the highly conductive material is at a greater spatial distance from the channel stopper structure in the at least one curved edge section than in the at least one rectilinear edge section.

13. A semiconductor component comprising:
two electrodes arranged opposite one another on opposite sides of a semiconductor body;
a doped zone of a first charge carrier type in the semiconductor body;
at least one doped zone of a second charge carrier type extending from a surface into a depth of the semiconductor body;
a pn junction formed by the doped zone of the first and second carrier types in a central region;
a rectilinear edge section being rectilinear in a plane parallel to the surface of the semiconductor body at least partly surrounding the central region;
a curved edge section being curved in the plane parallel to the surface of the semiconductor body at least partly surrounding the central region; and
means for providing a breakdown voltage in the rectilinear edge section that is less than a breakdown voltage in the curved edge section.

14. The semiconductor component of claim 13, further comprising:
a Junction Termination Extension (JTE) of the second charge carrier type formed in the semiconductor body at the surface thereof, and in a manner extending into the depth thereof, around the pn junction;
wherein the JTE is doped more weakly in comparison with the doped zone of the second charge carrier type of the pn junction;
wherein the JTE adjoins both the doped zone of the second charge carrier type of the pn junction and the doped zone of the first charge carrier type of the semiconductor body; and
wherein the JTE has a larger lateral dimensioning in the curved edge section than in the rectilinear edge section.

15. The semiconductor component of claim 13, further comprising:
a Junction Termination Extension (JTE) of the second charge carrier type formed in the semiconductor body at the surface thereof, around the pn junction;
wherein the JTE is doped more weakly in comparison with the doped zone of the second charge carrier type of the pn junction;
wherein the JTE adjoins both the doped zone of the second charge carrier type of the pn junction, and the doped zone of the first charge carrier type of the semiconductor body; and
wherein the JTE has a laterally varying dopant concentration, the dopant concentration in the vicinity of the doped zone of the second charger carrier type of the pn junction being lower in the rectilinear edge section than in the curved edge section.

16. The semiconductor component of claim 13, further comprising:
a Junction Termination Extension (JTE) of the second charge carrier type formed in the semiconductor body at the surface thereof, around the at least one pn junction;

wherein the JTE is doped more weakly in comparison with the doped zone of the second charge carrier type of the pn junction;

wherein the JTE adjoins both the doped zone of the second charge carrier type of the pn junction and the doped zone of the first charge carrier type of the semiconductor body; and wherein the JTE has a laterally varying dopant concentration, the lateral width of the laterally varying dopant concentration being smaller in the rectilinear edge section than in the curved edge section.

17. The semiconductor component of claim 13, further comprising:

a field ring of the second charge carrier type formed in the semiconductor body at the surface thereof, and in a manner extending toward the depth;

wherein the field ring surrounds the pn junction;

wherein the field ring is separated from the doped zone of the second charge carrier type of the pn junction by the doped zone of the first charge carrier type of the semiconductor body; and wherein the field ring is at a greater spatial distance from the doped zone of the second charge carrier type of the pn junction in the rectilinear edge section than in the curved edge section.

18. The semiconductor component of claim 17, further comprising a plurality of field rings, wherein the distance between at least one field ring and a field ring situated further innerly is enlarged in the rectilinear edge section in comparison with the curved edge section.

* * * * *